(12) United States Patent
Stockmeier et al.

(10) Patent No.: US 6,958,534 B2
(45) Date of Patent: Oct. 25, 2005

(54) POWER SEMICONDUCTOR MODULE

(75) Inventors: Thomas Stockmeier, Nürnberg (DE); Jürgen Steger, Hilpoltstein (DE)

(73) Assignee: Semikron Elektronik GmbH, Nürmberg (DE)

( * ) Notice: Subject to any disclaimer, the term of this patent is extended or adjusted under 35 U.S.C. 154(b) by 2 days.

(21) Appl. No.: 10/821,290

(22) Filed: Apr. 9, 2004

(65) Prior Publication Data
US 2004/0245548 A1 Dec. 9, 2004

(30) Foreign Application Priority Data
Apr. 10, 2003 (DE) .......................................... 103 16 355

(51) Int. Cl.[7] .......................... H01L 23/10; H01L 23/34; H01L 23/48; H01L 23/04; H01L 23/12
(52) U.S. Cl. ........................ 257/706; 257/690; 257/698; 257/700; 257/723; 257/724
(58) Field of Search ................................. 257/690, 698, 257/700, 706, 723, 724

(56) References Cited

U.S. PATENT DOCUMENTS 6,222,264 B1 * 4/2001 O'Neal et al. .............. 257/714
6,373,125 B1    4/2002 Pannaccione et al.
6,563,217 B2 *  5/2003 Corisis et al. .............. 257/738
2002/0149102 A1 * 10/2002 Hashemi et al. ............ 257/706
2004/0026778 A1 *  2/2004 Grant ......................... 257/706

FOREIGN PATENT DOCUMENTS

DE           42 37 632 A1      5/1994
DE           196 30 173 C2     1/1998

* cited by examiner

*Primary Examiner*—Ngân V. Ngô
(74) *Attorney, Agent, or Firm*—Cohen, Pontani, Lieberman & Pavane

(57) ABSTRACT

A power semiconductor module has a base plate comprising a framelike housing, a cap, and at least one electrically insulated substrate disposed inside the housing. The substrate comprises an insulation body with a plurality of metal connection tracks located thereon and insulated from one another, power semiconductor components located on the connection tracks, and terminal elements leading to the outside of the power semiconductor module for load and auxiliary contacts. Some of these terminal elements in the interior of the power semiconductor module comprise contact springs, which are disposed between the connection tracks and contact points on a printed circuit board. The printed circuit board has conductor tracks, which connect the contact points to contact elements that lead to the outside of the power semiconductor module.

18 Claims, 4 Drawing Sheets

US 6,958,534 B2

POWER SEMICONDUCTOR MODULE

BACKGROUND OF THE INVENTION

1. Field of the Invention

The invention is directed to a power semiconductor module. The inventive power semiconductor module comprises a housing for mounting directly or indirectly on a heat sink and at least one electrically insulated substrate disposed in it. This substrate in turn comprises an insulation body with a plurality of metal connection tracks located on it and insulated from one another, and power semiconductor components located on the connection tracks and connected to the connection tracks with appropriate wiring. Advantageously, the substrate, on its underside, has a flat metal layer that is comparable to the connection tracks. Such power semiconductor modules moreover have terminal elements for load and auxiliary contacts.

2. Description of the Related Art

Known power semiconductor modules are shown for example in German Patent Disclosure DE 42 37 632 A1 and German Patent DE 196 30 173 C2. Such power semiconductor modules have terminal elements, at least some of which are embodied as contact springs, for connecting the connection tracks of the substrate to external terminals. These contact springs are disposed in the power semiconductor module in such a way that they mimic the terminal occupation in the interior of the substrate to the external terminals.

A disadvantage of the prior art described above is that the external terminal occupation is thus specified directly by the internal terminal occupation. External wiring, such as driver circuits, must therefore be adapted to the specific internal terminal occupation of the power semiconductor module.

German Patent Disclosure DE 100 25 696 A1, for example, discloses a power semiconductor module with a printed circuit board disposed perpendicularly to the substrate. This printed circuit board is disposed with one portion inside and with another portion outside the power semiconductor module and thus forms the terminal elements of this power semiconductor module.

A disadvantage of this arrangement is that the external terminal occupation is once again fixed by the location of the printed circuit board.

SUMMARY OF THE INVENTION

The object of the present invention is to present a power semiconductor module in which the internal terminal occupation is embodied with appropriate wiring and can be adapted by simple provisions to an external terminal occupation deviating from it.

A power semiconductor module in accordance with the invention include a base plate or a framelike housing with at least one electrically insulated substrate disposed therein. This substrate in turn comprises an insulation body, having a plurality of metal connection tracks located on its first main face and insulated from one another, and preferably a flat metal layer disposed on its second main face. A plurality of power semiconductor components are disposed on the connection tracks of the first main face and connected to the connection tracks with appropriate wiring. The power semiconductor module of the invention has terminal elements, leading to the outside, for load and auxiliary contacts. At least some of these terminal elements are formed in the interior of the power semiconductor module by contact connectors, preferably contact springs, which are disposed in a retaining device between connection tracks and contact points that are disposed on a printed circuit board. The printed circuit board has conductor tracks which connect these contact points to contact elements that lead to the outside and are also disposed on this printed circuit board.

Advantageously, the functionality of the power semiconductor module can be enhanced by providing further components on the printed circuit board.

It is advantageous in this embodiment of a power semiconductor module that the external terminal occupation can be selected independently of the internal terminal occupation. Thus, when a change is made either in the substrate or substrates or in the type or number of power semiconductor components, it is not necessary to change driver boards, for instance, as well.

The invention will now be described in further detail in terms of exemplary embodiments in conjunction with FIGS. 1–6.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings:

FIG. 1b shows a printed circuit board used with the partial module of FIG. 1a;

DETAILED DESCRIPTION OF THE PRESENTLY PREFERRED EMBODIMENTS

Figure 1A:
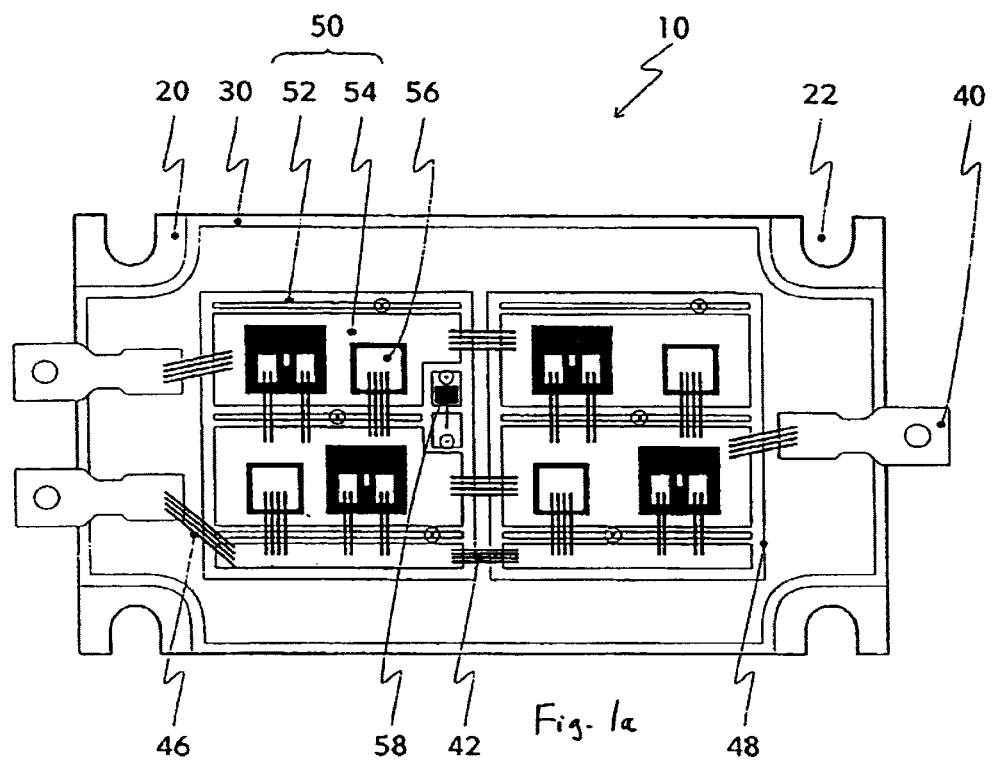
FIG. 1a shows a partial module of a power semiconductor module of the invention in plan view.
Figure 1B:
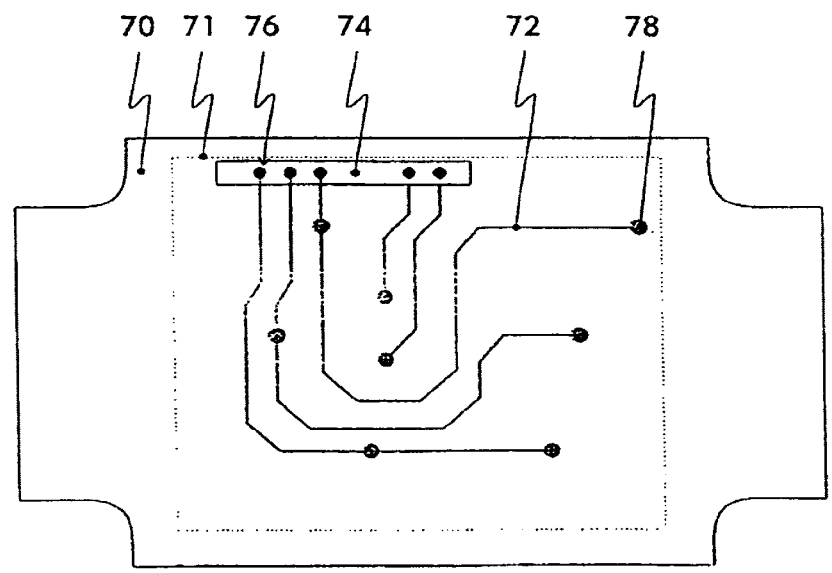

FIGS. 1a and 1b show a power semiconductor module of the invention in plan view. A power semiconductor module 10 is shown, comprising a base plate 20, for mounting on a heat sink. To that end, base plate 20 has one recess 22 in the region of each of its corners. The module further comprises a framelike housing 30 as well as two electrically insulated substrates 50. Each substrate in turn comprises an insulation body 52 with a plurality of metal connection tracks 54, located on its main face remote from base plate 20 and insulated from one another. On its main face, which faces the base plate, the substrate has a flat metallization 53 (see FIG. 2) similar to the connection tracks of the first main face. Both power semiconductor components 56 and a sensor system component 58 are disposed on connection tracks 54 and connected thereto with appropriate wiring by wire bond connections. For making electrical contact, the partial module 10 has terminal elements 40 for the load terminals. The connection tracks 54 of the substrates 50 are connected in part to one another and to the terminal elements 40 by wire bond connections 42, 44, 46.

The power semiconductor component of the invention moreover has spring contacts 60, which are disposed on an auxiliary frame, not shown. Spring contacts 60 connect connection tracks 54 to contact points on a printed circuit board 71 (FIG. 1b). These contact points are disposed on the underside of printed circuit board 71, which furthermore has conductor tracks 72 on this underside, which faces substrate 50. Conductor tracks 72 connect contact points 78 to contact elements that lead to the outside, in this case plug pin connectors 74. As an alternative for this purpose, soldered eyelets or soldered pins may serve as the contact elements. These contact elements penetrate the cap 70 and thus represent the external terminal occupation. This external terminal occupation deviates markedly from the internal terminal occupation that is represented by the points of contact of spring contacts 60 on substrate 50. Thus, the power semiconductor component of the invention makes an external terminal occupation possible that is completely different from the internal terminal occupation.

FIGS. 2–5 show side views of various embodiments of a power semiconductor module 10 of the invention with a framelike housing 30. A so-called DCB (direct copper bonding) substrate 50 is disposed on the base plate 20. This substrate comprises an insulation body 52, for instance an aluminum oxide or aluminum nitride ceramic, with a flat copper layer 53 on its side that faces the base plate and a structured copper layer 54 on its side remote from the base plate 20. This copper layer 54 acts as the connection tracks of the power semiconductor module. Components 56, usually power semiconductor components and sensor system components, are disposed on these connection tracks 54. The connections with appropriate wiring are made via wire bond connections 44.

Figure 2:
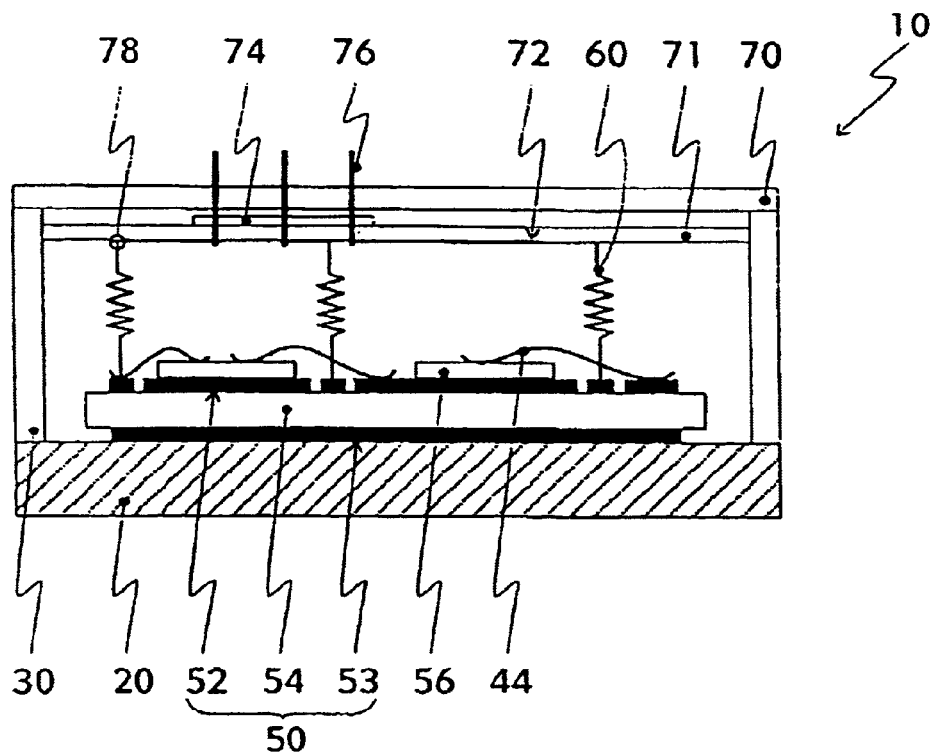
FIG. 2 shows one embodiment of a power semiconductor module of the invention in a side view.

In FIG. 2, the terminal elements in the first part of their course are formed by means of contact springs 60, which are disposed between points of contact on the connection tracks 54 and contact faces 78 on printed circuit board 71. As they extend further, the terminal elements are formed by connection tracks 72 on printed circuit board 71 and, leading to the outside, by means of contact pins 74 of a plug pin connector 76, also disposed on printed circuit board 71; contact pins 76 penetrate cap 70.

Figure 3:
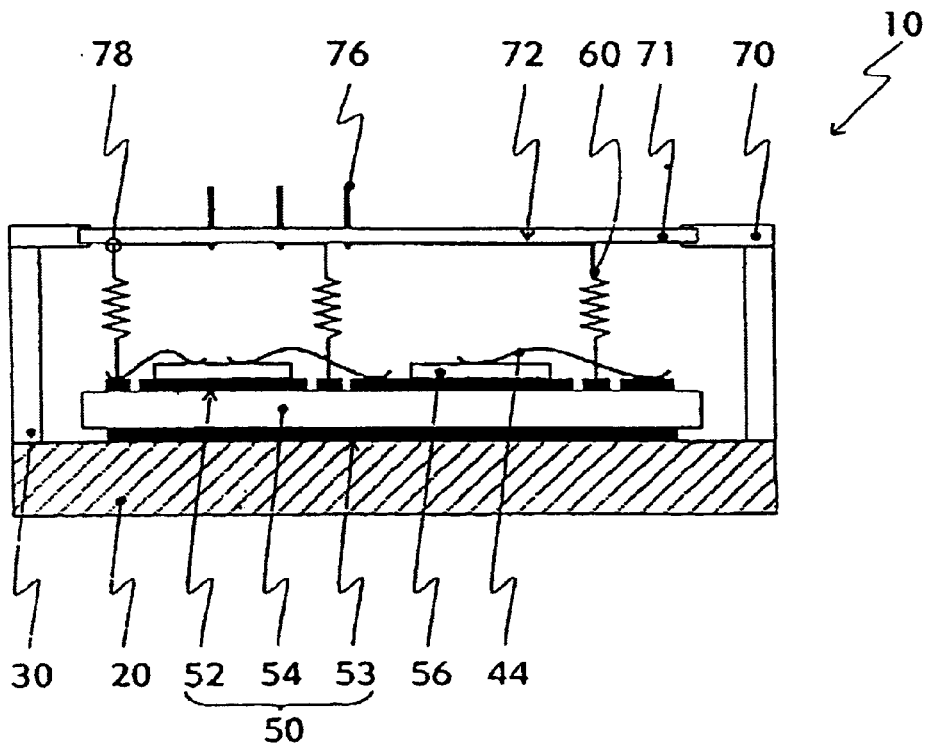
FIG. 3 shows a further embodiment of a power semiconductor module of the invention in a side view.

In FIG. 3, the terminal elements in the first part of their course are once again formed by contact springs 60 and conductor tracks 72 disposed on a printed circuit board. Printed circuit board 71, at whose contact faces 78 contact springs 60 come to an end, is, however, an integral component of cap 70. Cap 70 here has a framelike form and surrounds printed circuit board 71 on its edges, without completely covering it. Contact elements 76 for making external contact are formed by soldered pins which penetrate printed circuit board 71.

Figure 4:
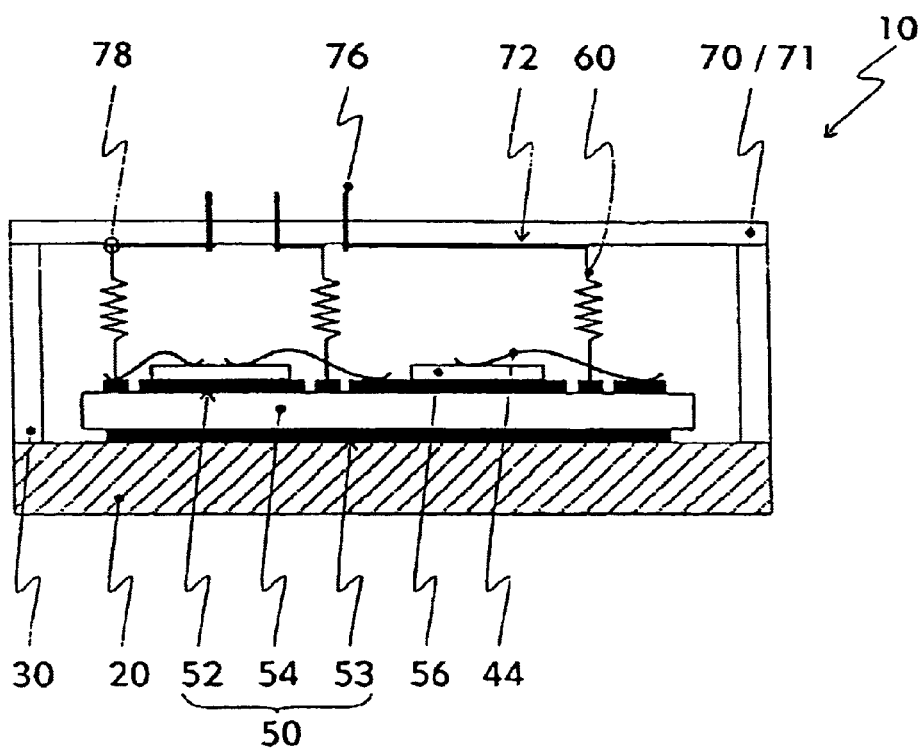
FIG. 4 shows a further embodiment of a power semiconductor module of the invention in a side view.

In FIG. 4, the most modern and simplest construction is shown. Here, cap 70 itself is embodied as printed circuit board 71, by disposing conductor tracks 72 directly on its inside. Such methods are known, for instance in the form of MIDs (molded interconnect devices). Contact elements 76 here are soldered pins injected into the plastic of cap 70.

Figure 5:
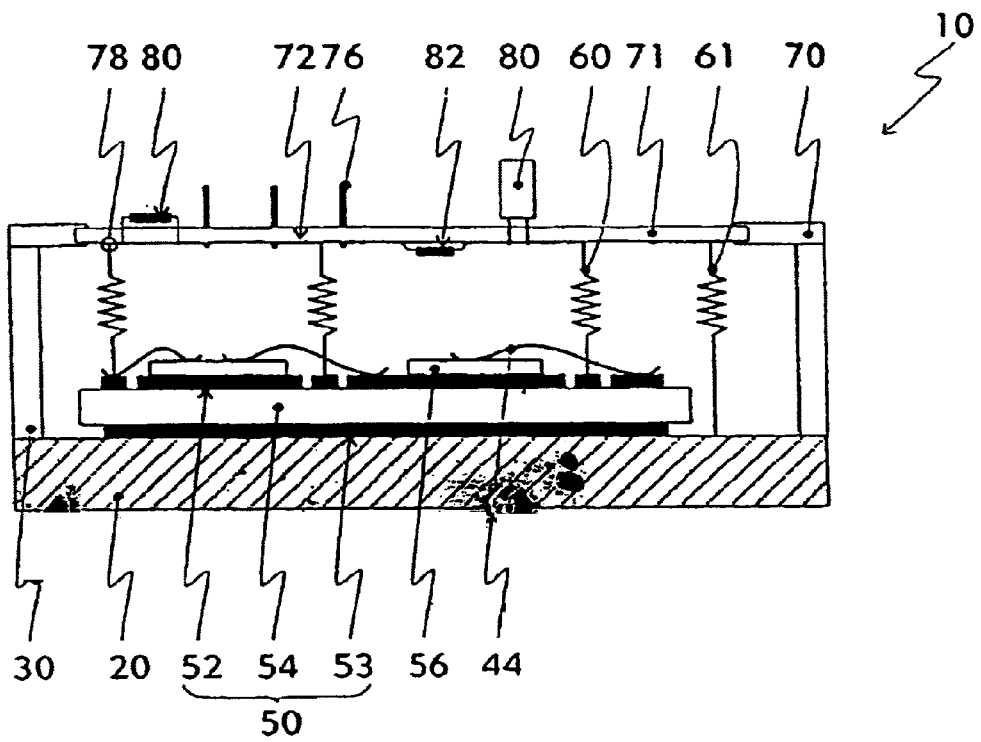
FIG. 5 shows an embodiment according to the invention of an intelligent power semiconductor module in a side view.

FIG. 5 shows a power semiconductor module of the invention with enhanced functionality. From the known power semiconductor module, by the disposition of further active and/or passive components, such as resistors, capacitors, integrated circuits, an intelligent power semiconductor module is made, since here at least in part the functionality of a driver circuit or other circuit (evaluation wiring, sensor system wiring) is disposed directly in or on the module. If load terminals of the described type are also embodied, then current sensors and evaluation circuits therefor can also be disposed on printed circuit board 71.

FIG. 5 also shows an additional contact connector, which is a contact spring 60 that connects base plate 20 and thus also electrically conductively connects the heat sink to printed circuit board 71. Thus, it is possible to place evaluation circuits, for example, on printed circuit board 71.

Figure 6:
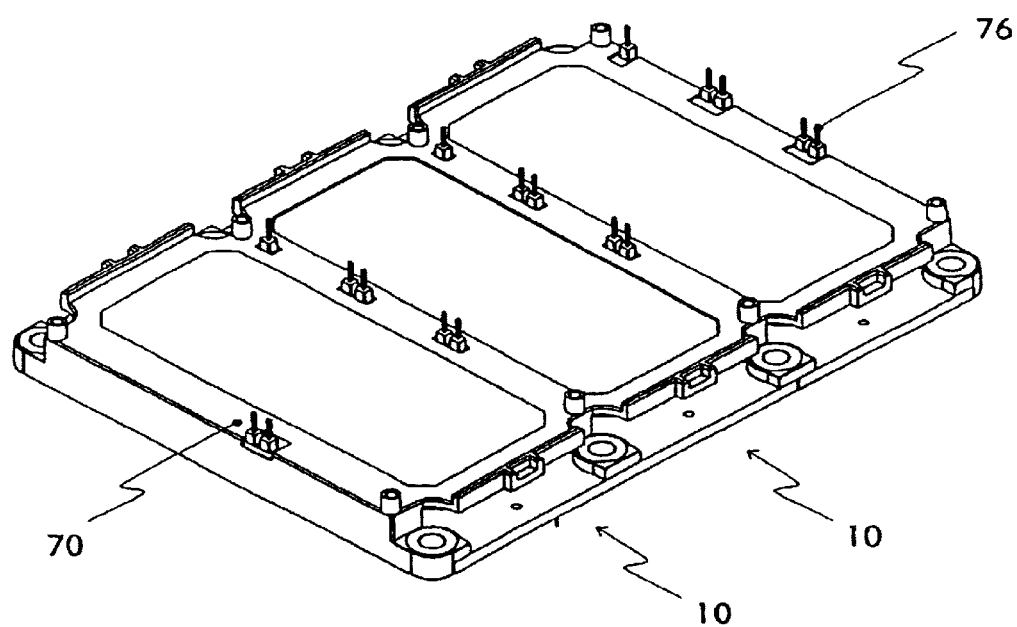
FIG. 6 shows an arrangement of three power semiconductor modules of the invention in a perspective view.

FIG. 6 shows an arrangement of three power semiconductor modules of the invention in a three-dimensional view. Here, three power semiconductor modules 10, each with one half-bridge circuit, forms a three-phase bridge circuit. A common cap 70 with an arrangement of the conductor tracks 72 and contact elements 76 as in FIG. 5 covers all three individual modules 10.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module for mounting to a heat sink, comprising:
    a framelike housing having an interior and an exterior;
    a cap; and
    at least one electrically insulated substrate, disposed in said interior of said housing, which substrate includes an insulation body with a plurality of metal connection tracks located thereon and insulated from one another, power semiconductor components located on the connection tracks and electrically connected to said connection tracks, and terminal elements, leading to said exterior of said housing;
    wherein at least some of said terminal elements in said interior of said housing are formed by contact connectors that are disposed between connection tracks and contact points on a printed circuit board, and wherein said printed circuit board has conductor tracks which connect said contact points to contact elements leading to said exterior of said housing.

2. The power semiconductor module of claim 1, wherein said heat sink is also connected to said printed circuit board by at least one contact connector.

3. The power semiconductor module of claim 1, wherein said contact connectors are contact springs.

4. The power semiconductor module of claim 1, wherein said printed circuit board is disposed inside said power semiconductor module, between said substrate and said cap, and said printed circuit board includes contact elements which extend through both said printed circuit board and said cap.

5. The power semiconductor module of claim 1, wherein said printed circuit board is embedded in said cap.

6. The power semiconductor module of claim 1, wherein said printed circuit board is formed in said cap, with conductor tracks disposed on the inside of said cap, and wherein said power semiconductor module has contact elements extending through said cap.

7. The power semiconductor module of claim 1, wherein said contact elements are plug pin connectors.

8. The power semiconductor module of claim 1 wherein said contact elements are soldered eyelets.

9. The power semiconductor module of claim 1, wherein at least one substrate includes a sensor system component.

10. The power semiconductor module of claim 1, further comprising electronic components disposed on said printed circuit board and electrically connected to said connection tracks.

11. The power semiconductor module of claim 10, wherein
said heat sink is also connected to said printed circuit board by at least one contact connector.

12. The power semiconductor module of claim 10, wherein
said contact connectors are contact springs.

13. The power semiconductor module of claim 10, wherein
said printed circuit board is disposed inside said power semiconductor module, between said substrate and said cap, and said printed circuit board includes contact elements which extend through both said printed circuit board and said cap.

14. The power semiconductor module of claim 10, wherein
said printed circuit board is embedded in said cap.

15. The power semiconductor module of claim 10, wherein
said printed circuit board is formed in said cap, with conductor tracks disposed on the inside of said cap, and wherein said power semiconductor module has contact elements extending through said cap.

16. The power semiconductor module of claim 10, wherein
said contact elements are plug pin connectors.

17. The power semiconductor module of claim 10 wherein said contact elements are soldered eyelets.

18. The power semiconductor module of claim 10, wherein at least one substrate includes a sensor system component.

* * * * *